United States Patent
Fiebig

(10) Patent No.: US 9,266,206 B2
(45) Date of Patent: Feb. 23, 2016

(54) DEVICE FOR TEMPERING A RECEPTACLE IN A CHAMBER

(71) Applicant: Dockweiler Aktiengesellschaft, Neustadt-Glewe (DE)

(72) Inventor: Klaus-Dieter Fiebig, Reinbek (DE)

(73) Assignee: Dockweiler Aktiengesellschaft, Neustadt-Glewe (DE)

( * ) Notice: Subject to any disclaimer, the term of this patent is extended or adjusted under 35 U.S.C. 154(b) by 381 days.

(21) Appl. No.: 13/955,444

(22) Filed: Jul. 31, 2013

(65) Prior Publication Data

US 2014/0159297 A1 Jun. 12, 2014

(30) Foreign Application Priority Data

Jul. 31, 2012 (DE) .................. 10 2012 015 045

(51) Int. Cl.
  *B23Q 3/00* (2006.01)
  *B23Q 3/18* (2006.01)
  *H01L 21/67* (2006.01)

(52) U.S. Cl.
  CPC ............ *B23Q 3/18* (2013.01); *H01L 21/67017* (2013.01); *Y02E 60/321* (2013.01)

(58) Field of Classification Search
  USPC .......................... 269/287, 288; 220/288, 304
  See application file for complete search history.

(56) References Cited

U.S. PATENT DOCUMENTS

| | | | |
|---|---|---|---|
| 4,248,514 A | * | 2/1981 | Watkins .................. G03D 3/06 396/573 |
| 4,948,504 A | * | 8/1990 | Kierdorf ................ B01D 29/27 210/238 |
| 5,139,672 A | * | 8/1992 | Ohbayashi ............. B01D 29/27 210/452 |
| 2006/0290074 A1 | | 12/2006 | Ozdeslik et al. |

FOREIGN PATENT DOCUMENTS

| | | |
|---|---|---|
| DE | 624396 | 1/1936 |
| DE | 1750549 | 3/1971 |
| DE | 81 33 803.1 | 7/1982 |
| DE | 3407 112 C2 | 9/1985 |
| DE | 197 35 399 C2 | 2/1999 |
| EP | 0 160 779 A1 | 11/1985 |
| EP | 0 328 888 A1 | 8/1989 |
| EP | 1 529 855 A2 | 5/2005 |
| WO | 2004/096427 A1 | 11/2004 |
| WO | 2006/099619 A2 | 9/2006 |

OTHER PUBLICATIONS

Charles Chamberland (inventor); Autoclave, English translation from Wikipedia.

* cited by examiner

*Primary Examiner* — Lee D Wilson
*Assistant Examiner* — Shantese McDonald
(74) *Attorney, Agent, or Firm* — Vidas, Arrett & Steinkraus, P.A.

(57) ABSTRACT

A device for tempering a receptacle in a chamber, including a cylindrical casing surrounding the chamber, a bottom, which is arranged on an end of the casing and is connected with it, an opening on an end of the casing opposite to the bottom, which is limited by a contact surface running parallel to the bottom, an annular sealing element, which has a sealing leg and a contact leg, which rests on the contact surface and an annular tensioning element, which, placed on the sealing element, lies on the sealing leg on its outside.

15 Claims, 3 Drawing Sheets

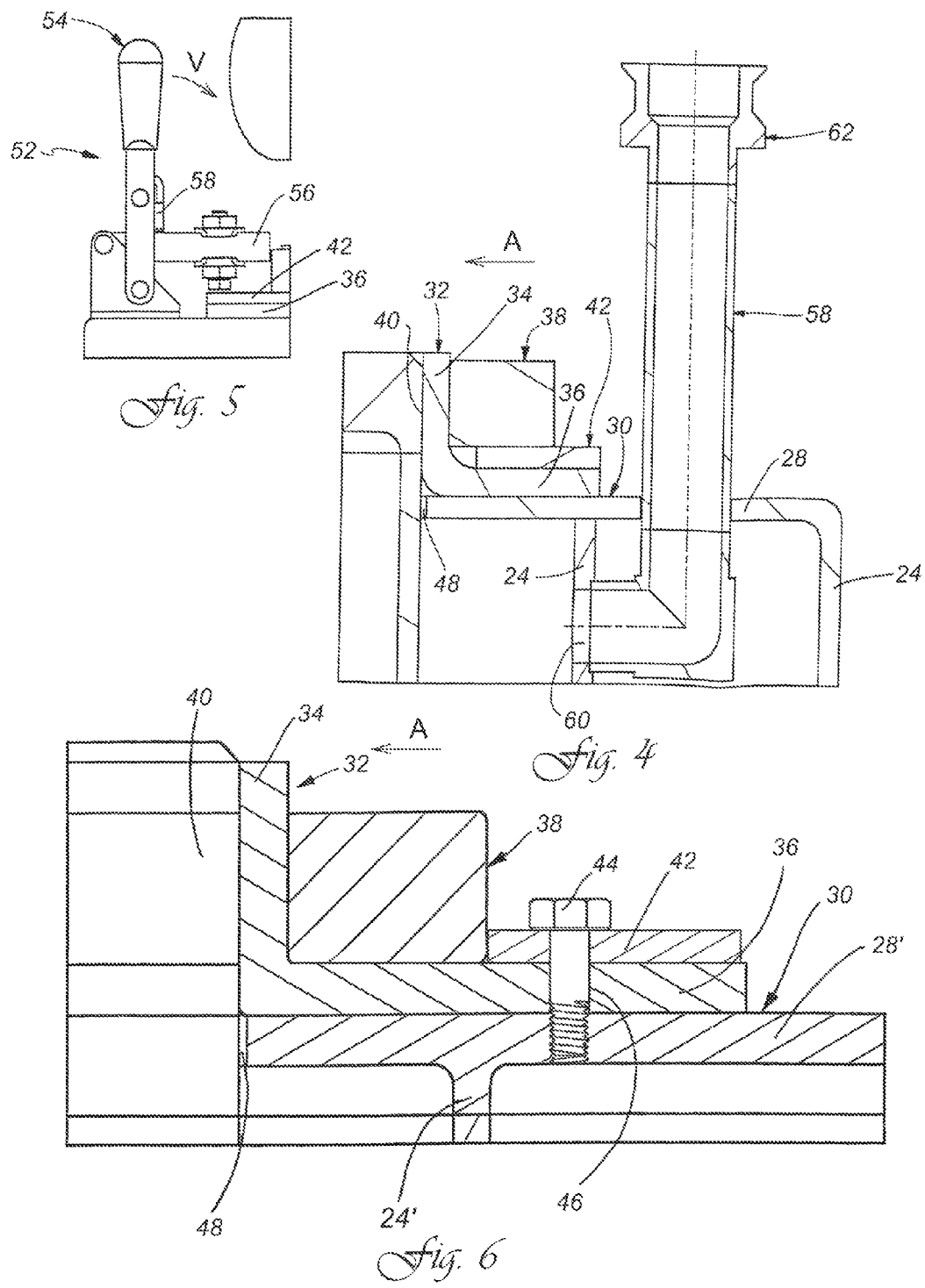

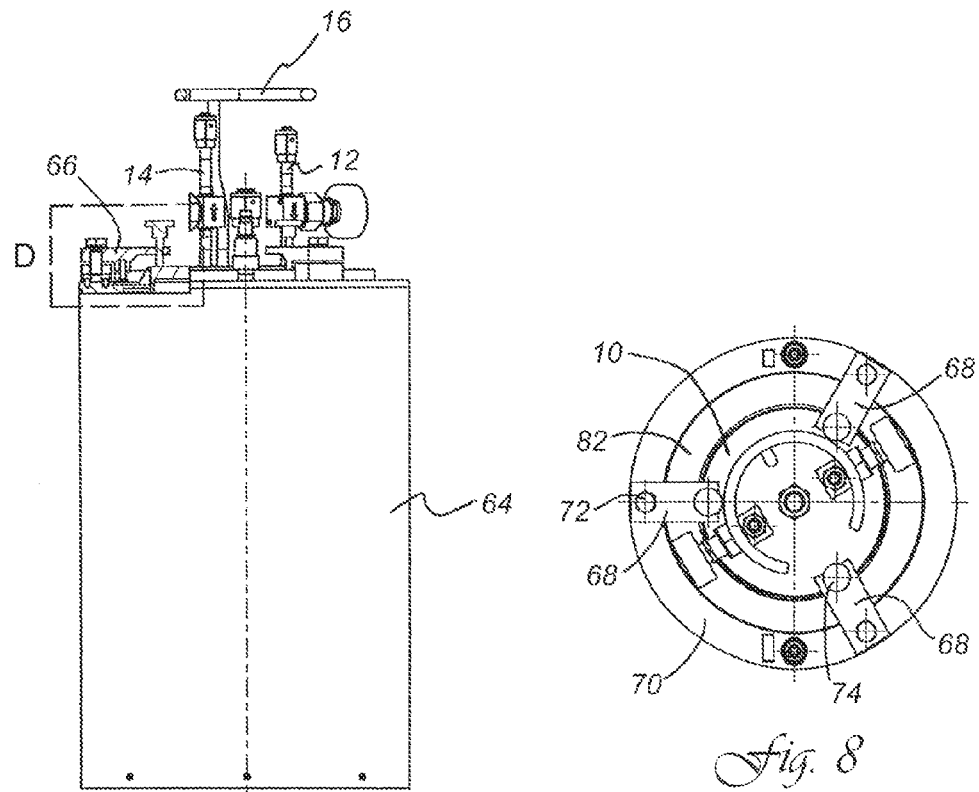
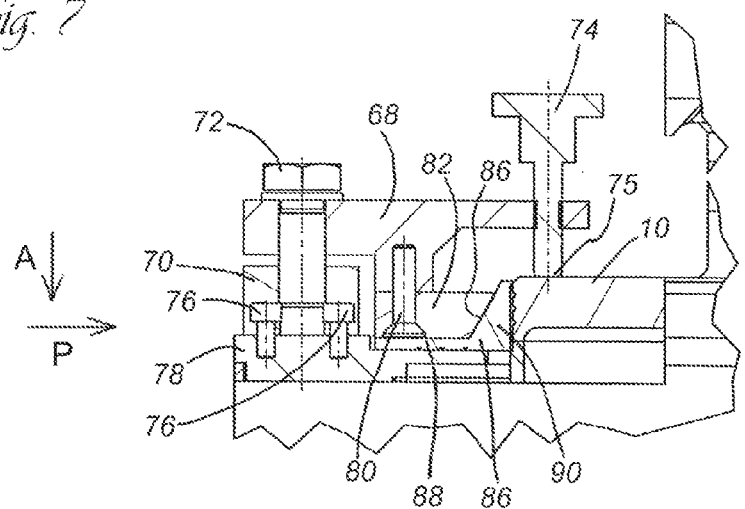

DEVICE FOR TEMPERING A RECEPTACLE IN A CHAMBER

CROSS-REFERENCE TO RELATED APPLICATIONS

Not applicable.

STATEMENT REGARDING FEDERALLY SPONSORED RESEARCH

Not applicable.

BACKGROUND OF THE INVENTION

The present invention relates to a device for tempering a receptacle in a chamber.

There is the need to precisely temper receptacles in which chemical media react with each other. Thus, it is for example known for chemical vapor deposition processes and/or for the doping of semi-conductors to very precisely temper a receptacle, also known as a bubbler, in which a doping gas is created, in a tempering device. For this, the receptacle is arranged in the tempering device and sealed outwardly. Since bubblers have tolerances and irregularities in their circumferential diameter caused for example by welded seams, the seal can be impaired in the tempering device. The tempering device is well insulated and is tempered in its chamber via a medium such as water or another tempering medium.

A cover closure for a pressure container, which has an L-shaped lip seal, which is arranged with a leg in an annular recess of the inner surface of the cover fastened on the container, is known from patent specification DE 1 750 549. A sealing lip rests on an inner surface of a flat annular groove of the cover closure.

A closure device for sterilization apparatuses working under excess pressure is known from patent specification DE 62 43 96 PS. A sealant arranged in a circumferential cover flange is hereby pressed onto a protruding sealing edge by means of clamping screws.

A device for tempering a good in a cylindrical chamber, in which the good to be tempered is bathed annularly with tempered air via a device of grooves, became known from DE 20 2004 010 834 U1.

BRIEF SUMMARY OF THE INVENTION

An object of the invention is to provide a device for tempering a receptacle in a chamber, which allows with simple means an appropriate and effective sealing of the chambers inside the device.

The device according to the invention is provided and determined to temper a receptacle, in particular a bubbler, in a chamber. The device has a cylindrical casing, which surrounds the chamber. Furthermore, a bottom is provided, which is arranged on an end of the casing and is connected with it. Furthermore, an opening with a contact surface running parallel to the bottom, which limits the diameter of the opening with respect to the inner diameter of the chamber, is located on the end opposite the bottom. The receptacle to be tempered is placed in the chamber through the opening. According to the invention, an annular sealing element, which has a sealing leg and a contact leg, wherein the contact leg lies on the contact surface, is provided. Additionally, an annular tensioning element is provided, which is placed on the sealing element and lies on the sealing leg on its outside. By setting the tensioning element, the sealing leg with its inside can be tensioned against the outside of the receptacle and the chamber can thus be sealed off. The advantage of an annular sealing element that has two legs is that the seal can be removed from the chamber for inserting and removing the receptacle and thus the receptacle is particularly easy to arrange in and remove from the chamber. Moreover, different outer diameters of the receptacle can be compensated for by the tensioning element. The entire device can also be used for receptacles with different diameters by selecting a suitable sealing element and the suitable tensioning element. Through the seal according to the invention via a tensioned sealing element, it is also made possible to operate the tempering device with excess pressure, i.e. to incorporate a pressurized tempering medium in the intermediate space between the receptacle and the inside of the chamber wall.

In a preferred embodiment, the device also has connection means, with which the contact leg is fastenable on the contact surface. Advantageously, the contact leg of the seal has bore holes for the connection means. Via the connection means, which fasten the sealing element on the device in addition to the tensioning element, the sealing element can be fastened on the contact surface in the axial direction relative to the longitudinal direction of the chamber. A pressure plate and screws, which are fitted on the contact leg of the sealing element and are fastened through the sealing element with the screws, are preferably provided as connection means. Alternatively or additionally, a quick-change clamping device can be provided, which presses the contact leg or a pressing ring arranged on it for example via a toggle mechanism against the contact surface of the tempering device.

In a preferred embodiment, the sealing element is designed as a circumferential ring, on which the sealing leg and contact leg are arranged substantially perpendicular to each other.

In a preferred embodiment, the sealing element is dimensioned such that it overhangs the contact surface radially inwards. In this manner, the sealing element is particularly elastic in the radial direction and can adapt to different diameters of the receptacle. The sealing of the chamber then takes place through the inside of the sealing leg resting on the receptacle and the bottom side of the contact surface pointing towards the chamber.

The device is also provided with at least one inflow and/or outflow tube for a tempering medium in the chamber. The tempering medium is preferably externally pretempered and fed to the chamber in the desired temperature. In order to avoid thermal losses to the device, the casing and/or the bottom of the device is designed double-walled and insulated thermally. In the case of a single-walled model of the device, an insulating casing consisting of half shells can be provided, which, arranged on the outside of the device, also insulates it.

In a preferred embodiment, an inflow tube for the tempering medium flows into the base of the chamber, preferably centrally on the base below a receptacle arranged in the chamber. Through the tempering medium introduced below the receptacle, it can be distributed well in the chamber and the receptacle can be tempered evenly.

In a preferred embodiment, the sealing leg of the sealing element has a wedge or trapezoidal shape. The inside of the sealing leg is provided for attachment to the receptacle to be tempered. The outside runs sloped with respect to the inside. The tensioning element has a sloped pressure-loaded area, which preferably runs corresponding to the sloped outside of the sealing leg. In the installed state, the tensioning element preferably lies on the contact leg of the seal and with its pressure-loaded area on the sealing leg. One particular advantage of a tensioning element with a sloped pressure-loaded area is that the force applied to the tensioning element in the axial direction is converted into a radial force on the sealing leg through the sloped pressure-loaded area. For a permissible sealing of the receptacle arranged in the tempering device, only a force needs to be exerted in the axial direction on the tensioning element for tensioning the sealing leg.

In a preferred embodiment, the tensioning element is designed annularly and is connectable at three or more locations with the contact surface in order to press the pressure-loaded area against the outside of the sealing leg.

In a preferred embodiment, the tensioning element has at least one hold-down device on its side facing radially inward, which rests against a receptacle arranged in the chamber and prevents it from rising.

Preferred embodiments of the invention will be explained in greater detail below based on examples. In the figures:

BRIEF DESCRIPTION OF THE SEVERAL VIEWS OF THE DRAWINGS

FIG. 4 shows an enlargement of detail B from FIG. 1, FIG. 5 shows an enlargement of detail C from FIG. 1, FIG. 6 shows an alternative fastening of the sealing element, FIG. 7 shows a view of an alternative embodiment of the tempering device with inserted bubbler in a view from the side, FIG. 8 shows a view of the tempering device from FIG. 7 from above, and FIG. 9 shows detail D from FIG. 7.

DETAILED DESCRIPTION OF THE INVENTION

While this invention may be embodied in many different forms, there are described in detail herein a specific preferred embodiment of the invention. This description is an exemplification of the principles of the invention and is not intended to limit the invention to the particular embodiment illustrated.

Figures 1, 2:
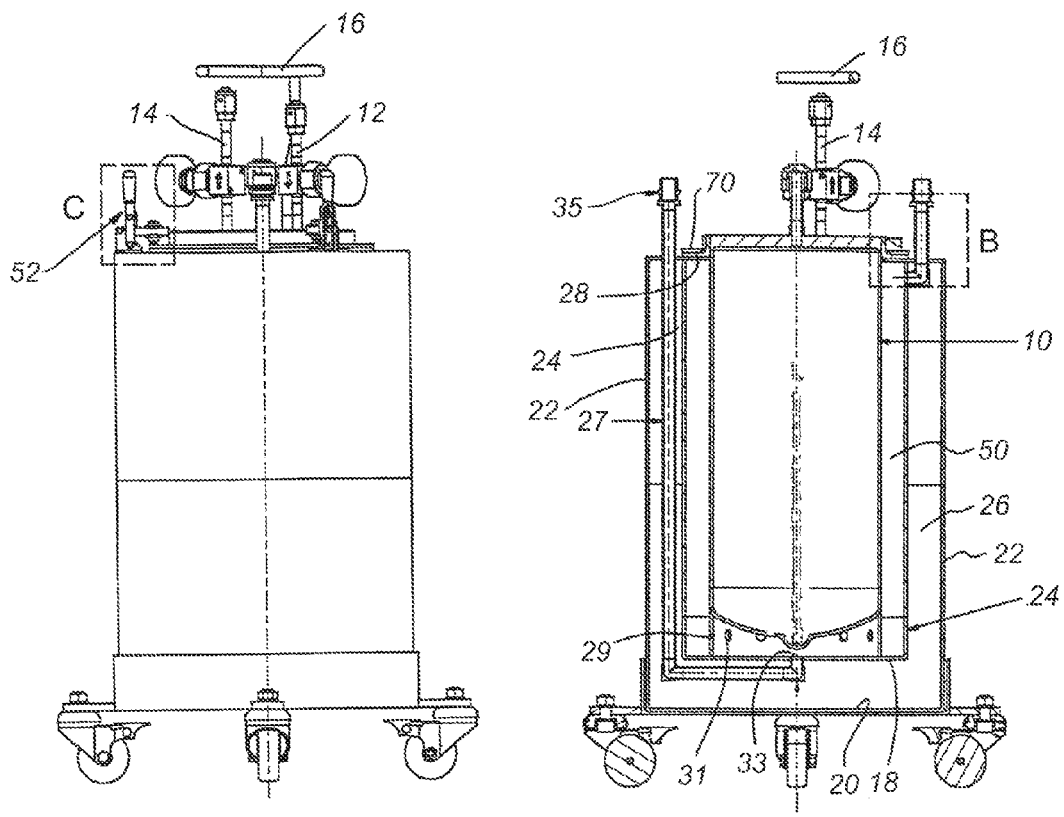
FIG. 1 shows a view of a tempering device with an inserted bubbler.
FIG. 2 shows a cross-section of the tempering device from FIG. 1 along the plane A-A from FIG. 3.
Figure 3:
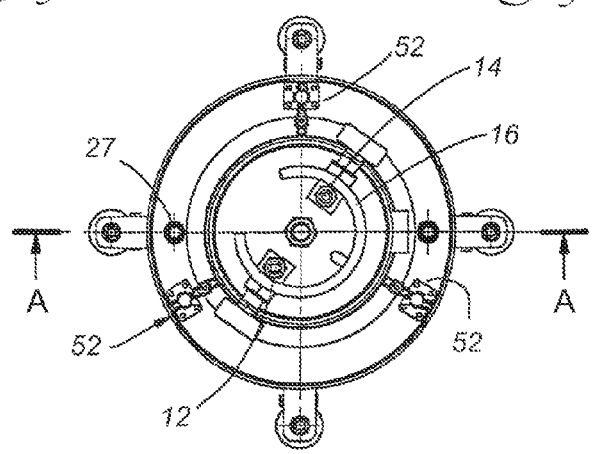
FIG. 3 shows a top view of the tempering element from FIG. 1.

FIG. 2 shows a cylindrical bubbler 10 with its supply and drain lines 12 and 14 in cross-section. $H_2$ gas is for example supplied to the bubbler via the supply line 12, where it reacts chemically and escapes again as doping gas via the drain line 14. For handling purposes, the bubbler has a centrally arranged handle 16, which is designed as a ring segment. In FIG. 1, the bubbler is inserted into the tempering device so that the connections for the supply and drain lines and the handle protrude from the tempering device.

The tempering device is designed double-walled in the example shown, wherein an inner bottom wall 18 and an outer bottom wall 20 are provided. The outer bottom wall 20 is welded to an outer cylindrical casing wall 22. The inner bottom wall 18 is welded to a cylindrical inner wall 24. The inner space 26 between the outer and inner wall and between the outer and inner bottom wall is filled with insulating material (not shown). Additionally, an inflow tube 27 is arranged in the inner space 26. The inflow tube 27 protrudes on the upper end 35 out of the tempering device and extends parallel to the casing wall 22 and the inner wall 24 into the bottom, where it exits through the inner bottom wall 18 at 33 at a 90° bend guided centrally into the chamber. The bubbler 10 has a foot 29, which consists of a circumferential wall with radial openings 31. The tempering medium exiting in the foot area of the bubbler on its end 33 is distributed within the foot 29 and flows over the openings 31 into an annularly cylindrical intermediate space 50, which is formed by the bubbler 10 in the chamber.

On the upper end of the tempering device, the outer casing wall 22 has a flange 28, which extends radially inward up to the inner casing wall 24 and protrudes radially inward into the chamber formed by the inner casing wall. The flange 28 has on its top side a contact surface 30, on which lies a sealing element 32 that is L-shaped in cross-section.

As can be seen in the detail view B from FIG. 4, the sealing element 32 has a vertically standing sealing leg 34 and a horizontally arranged sealing leg 36. The sealing leg 36 rests flat on the contact surface 30. A flat tensioning element 38 rests on the outside of the sealing leg 34. By actuating the tensioning element 38, it is tensioned radially inwards in the direction of the arrow A so that the inside of the sealing leg 34 rests sealingly on the outer surface of the bubbler 40. In the exemplary embodiment shown, the turnbuckle of the tensioning element 38 is shown. The tensioning element itself is designed as a flat ring. A circumferential ring 42 is provided for securing the contact leg 36 on the contact surface 30.

As shown in FIG. 6, the ring 42 can be screwed with the flange 28' via a screw 44. The screw 44 is guided through a bore hole 46 into the contact leg 36 of the sealing element 32 and thus secures the sealing element. In the example from FIG. 6, the flange 28' is designed on the inner casing wall 24' as a T flange, which is connected on its radially outer end (not shown) with the outer casing wall. Alternatively, the quick-change clamping device 52 provided in FIG. 5 can be provided, which has a lever 54 and a pressing arm 56. The ring 42 is pressed onto the contact leg 36 of the sealing element through tensioning in direction V via the toggle mechanism 58.

In the FIGS. 4 and 6, a gap 48 can be seen between the outside of the bubbler 40 and the flange 28, 28'. The gap is restricted upwards by the contact leg 36. Depending on the dimensions of the bubbler, the gap 48 can have different sizes but be equally effectively sealed via the sealing element 32. The tempering medium exits via the outlet tube 58 arranged on the upper end of the tempering device. The outlet tube 58 is connected via its opening 60 with the chamber and has a line adapter 62 on its end leading out of the tempering device.

FIG. 7 shows a tempering device 64, in which a bubbler 10 with its in supply and drain lines 12 and 14 and its handle 16 is arranged. In detail D shown in cross-section, a tensioning element 66 screwed with the casing of the tempering device 64 is represented. The tensioning element 66 has, as can be seen in the view from FIG. 8, three connection bridges 68, which are fastened on a circumferential profile edge 70 of the tempering device via bolts 72. A hold-down device 74, which rests on a front surface of the bubbler 10, is provided on the radially-inward-facing end of the connection bridges 68. A clamping ring 82 is pressed against the L-shaped seal by the connection bridge 68.

FIG. 9 shows the more detailed structure: A circular profile 70 is screwed with an upper cover 78 of the tempering device via bolts 76. A fastening bolt 72 is guided through the connection bridge 68 and connects it with the profile and the tempering device. The connection bridge 68 is connected with the clamping ring 82 via a screw 80 on its side facing the tempering device. The clamping ring 82 has a sloped pressure-loaded area 84 on its radially-inward-protruding side. The L-shaped sealing ring 86 has a contact leg 88 and a sealing leg 90. The sealing leg 90 has a wedge-like contour, wherein the thickness of the sealing leg 90 decreases from the contact leg 88 towards its free end. The sealing leg 90 rests on its radially-inward-facing leg side on the bubbler 10 to be tempered along its peripheral surface. By tightening the bolt 72, a force is exerted on the tensioning ring 82 in direction A via the connection bridge 68. The force is diverted radially inward in direction P via the sloped pressure-loaded area 84 so that the sealing leg 90 is pressed against the circumferential wall of the bubbler 10.

The hold-down device 74 is provided on the radially-inward-protruding end of the connection bridge 68. The hold-down device 74 has a thread, via which its position can be set relative to the connection bridge. The end 70 of the hold-down device 74 pointing towards the bubbler 10 rests, as shown in FIG. 9, on the top side of the bubbler so that it also cannot move in the axial direction. The pressing force of the sealing leg 90 is hereby maintained.

During operation of the tempering device, the intermediate space 50 between the inner wall and the receptacle is rinsed with a tempering medium, for example with water. The temperature of the cooling medium can be set very precisely through the sealing and insulating of the container wall and the bubbler on the whole can thus be very precisely tempered. Through the pressing force of the tensioning element, a seal is thereby achieved that also allows operation with a pressurized cooling medium.

This completes the description of the preferred and alternate embodiments of the invention. Those skilled in the art may recognize other equivalents to the specific embodiment described herein which equivalents are intended to be encompassed by the claims attached hereto.

What is claimed is:

1. A device for tempering a receptacle in a chamber, comprising:
    a cylindrical casing surrounding the chamber,
    a bottom, which is arranged on an end of the casing and is connected with it,
    an opening on an end of the casing opposite to the bottom, which is limited by a contact surface running parallel to the bottom,
    an annular sealing element having a sealing leg and a contact leg which rests on the contact surface and
    an annular tensioning element, which, placed on the sealing element, lies on the sealing leg on its outside.

2. The device according to claim 1, wherein connection means are provided with which the contact leg is fastenable on the contact surface.

3. The device according to claim 2, wherein the contact leg has bore holes for the connection means.

4. The device according to claim 2, wherein the connection means has a pressing plate and screws.

5. The device according to claim 2, wherein at least one quick-change clamping device is provided as connection means which presses the contact leg onto the contact surface in its tensioned state.

6. The device according to claim 5, wherein the quick-change clamping device has a toggle mechanism which is attached to the contact surface and can press the contact leg against the contact surface via an arm.

7. The device according to claim 1, wherein in that the sealing leg and contact leg of the sealing element mainly stand perpendicular to each other.

8. The device according to claim 1, wherein the sealing element overhangs the contact surface radially inwards.

9. The device according to claim 1, wherein at least one inflow and/or outflow tube is provided for a tempering medium in the chamber.

10. The device according to claim 9, wherein the inflow tube flows into the base of the chamber.

11. The device according to claim 1, wherein the casing and/or the bottom is designed double-walled.

12. The device according to claim 1, wherein the sealing leg (90) has a wedge or trapezoidal shape, in which the inside of the sealing leg is provided for attachment to the receptacle to be tempered and the outside runs sloped with respect to the inside and the tensioning element has a sloped pressure-loaded area.

13. The device according to claim 12, wherein the tensioning element in its installed position rests on the contact leg and lies with its contact surface on the sealing leg.

14. The device according to claim 12, wherein the tensioning element is designed annularly and is connectable at three or more locations with the contact surface in order to press the pressure-loaded area against the outside of the sealing leg.

15. The device according to claim 14, wherein the tensioning element has at least one hold-down device for a receptacle arranged in the chamber on its radially-inward-facing side.

* * * * *